(12) United States Patent
Zhou et al.

US008659292B2

(10) Patent No.: US 8,659,292 B2
(45) Date of Patent: Feb. 25, 2014

(54) MR SENSOR WITH FLUX GUIDE ENHANCED HARD BIAS STRUCTURE

(75) Inventors: Yuchen Zhou, San Jose, CA (US); Tong Zhao, Fremont, CA (US); Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1023 days.

(21) Appl. No.: 12/660,909

(22) Filed: Mar. 5, 2010

(65) Prior Publication Data

US 2011/0215800 A1   Sep. 8, 2011

(51) Int. Cl.
*G01R 33/02* (2006.01)

(52) U.S. Cl.
USPC ............. 324/252; 324/207.11; 324/207.15; 324/117 R; 324/117 H; 324/262; 360/324.12

(58) Field of Classification Search
USPC ............ 324/661, 663, 665, 672, 679, 207.11, 324/207.15, 207.13, 207.21, 252, 260, 262, 324/244, 117 R, 117 H; 73/862.192, 862.55; 338/32 R
See application file for complete search history.

(56) References Cited

U.S. PATENT DOCUMENTS

| | | | | |
|---|---|---|---|---|
| 6,005,753 A * | 12/1999 | Fontana et al. | ............ | 360/324.2 |
| 6,223,420 B1 * | 5/2001 | Lee et al. | .................... | 29/603.14 |
| 6,338,899 B1 * | 1/2002 | Fukuzawa et al. | ....... | 360/324.12 |
| 6,538,430 B2 * | 3/2003 | Carrington et al. | ........... | 324/210 |
| 6,635,366 B2 * | 10/2003 | Saito et al. | ..................... | 428/811 |
| 6,656,604 B2 * | 12/2003 | Hasewaga | ..................... | 428/611 |
| 7,061,731 B2 | 6/2006 | Larson et al. | | |
| 7,111,385 B2 | 9/2006 | Chau et al. | | |
| 7,170,721 B2 | 1/2007 | Wu | | |
| 7,237,322 B2 | 7/2007 | Gill | | |
| 7,259,941 B2 | 8/2007 | Pinarbasi | | |
| 7,265,951 B2 | 9/2007 | Gill | | |
| 7,468,870 B2 * | 12/2008 | Arasawa et al. | ......... | 360/324.12 |
| 2004/0121185 A1 * | 6/2004 | Fukuzawa et al. | ............ | 428/692 |
| 2004/0218310 A1 | 11/2004 | Nishioka | | |
| 2006/0158793 A1 * | 7/2006 | Arasawa et al. | ......... | 360/324.12 |
| 2007/0281079 A1 * | 12/2007 | Carey et al. | .................... | 427/131 |
| 2008/0117553 A1 | 5/2008 | Carey et al. | | |
| 2009/0002898 A1 * | 1/2009 | Childress et al. | .......... | 360/324.1 |
| 2010/0182723 A1 * | 7/2010 | Yanagisawa | ............. | 360/324.12 |

OTHER PUBLICATIONS

International Search Report PCT/US 11/00327 Mail date—Apr. 29, 2011, Headway Technologies.
"Thermally Excited Low Frequency Magnetic Noise in CPP Structure MR Heads," by Yuchen Zhou, IEEE Transactions on Magnetics, vol. 43, No. 6, Jun. 2007, pp. 2187-2192.

* cited by examiner

*Primary Examiner* — Jermele M Hollington
*Assistant Examiner* — Temilade S Rhodes-Vivour
(74) *Attorney, Agent, or Firm* — Saile Ackerman LLC; Stephen B. Ackerman

(57) ABSTRACT

A CPP MR sensor interposes a tapered soft magnetic flux guide (FG) layer between a hard magnetic biasing layer (HB) and the free layer of the sensor stack. The flux guide channels the flux of the hard magnetic biasing layer to effectively bias the free layer, while eliminating instability problems associated with magnetostatic coupling between the hard bias layers and the upper and lower shields surrounding the sensor when the reader-shield-spacing (RSS) is small.

43 Claims, 4 Drawing Sheets

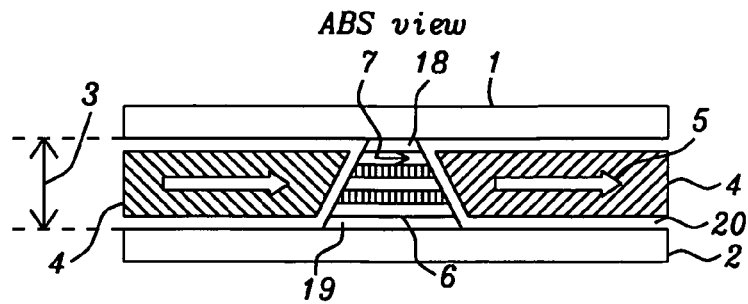
FIG. 1a – Prior Art
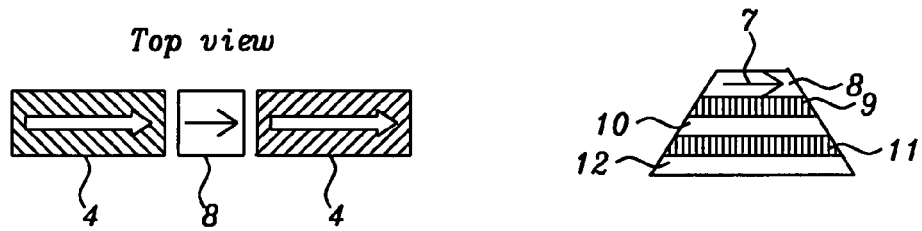
FIG. 1b – Prior Art
FIG. 1c – Prior Art
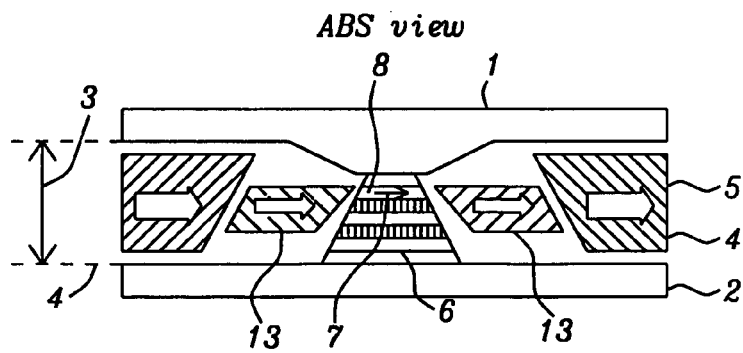
FIG. 2a – Prior Art
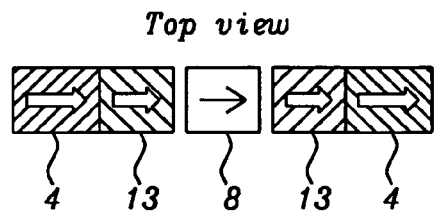
FIG. 2b – Prior Art

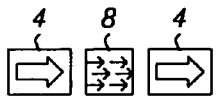
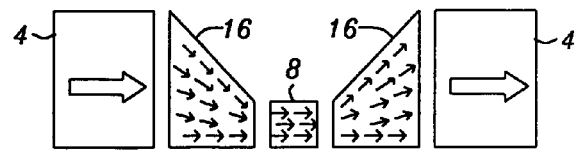
FIG. 5a – Prior Art
FIG. 5b
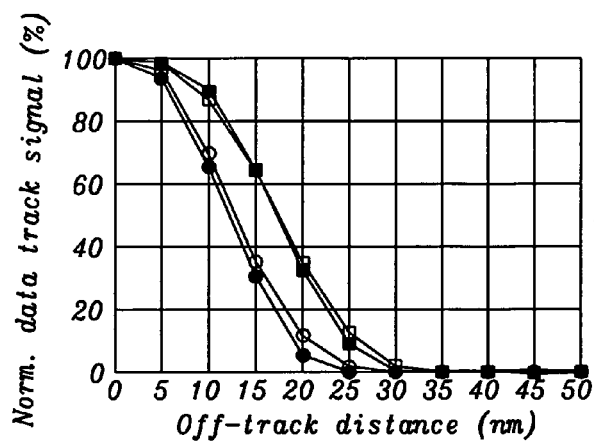
FIG. 6a
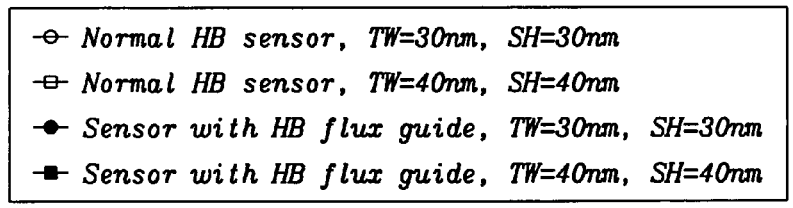
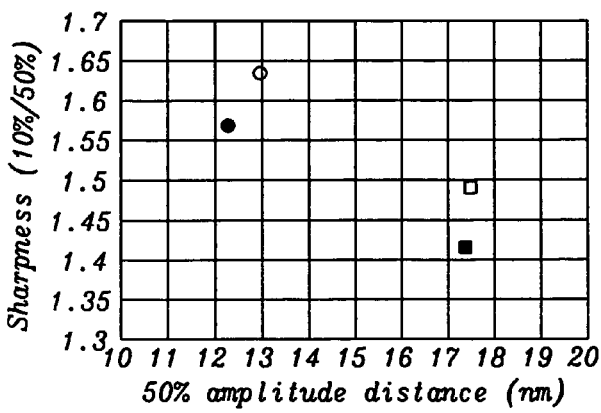
FIG. 6b

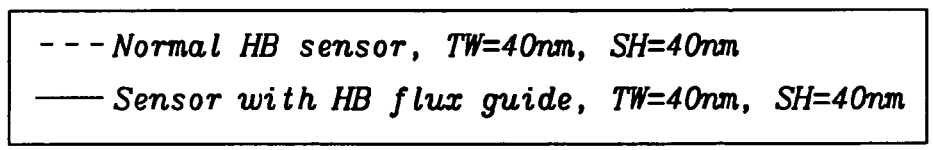
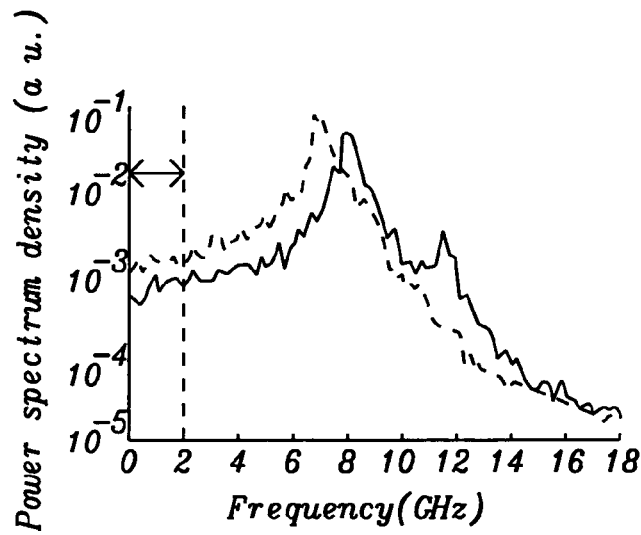
FIG. 7
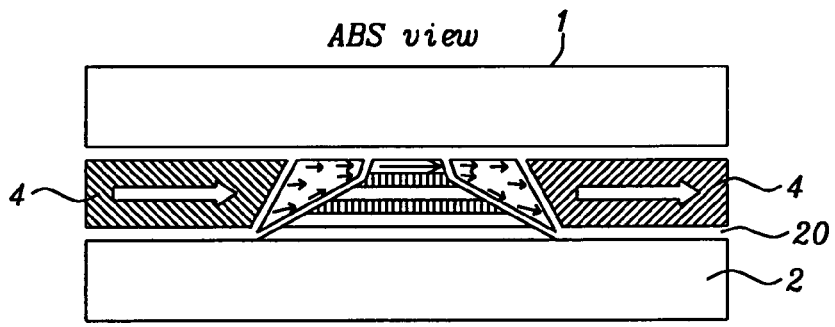
FIG. 8a
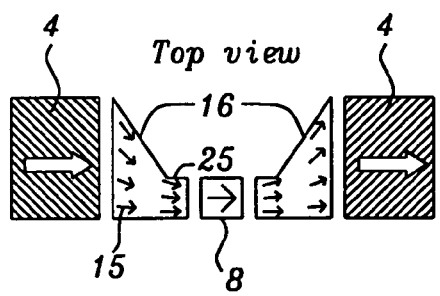
FIG. 8b
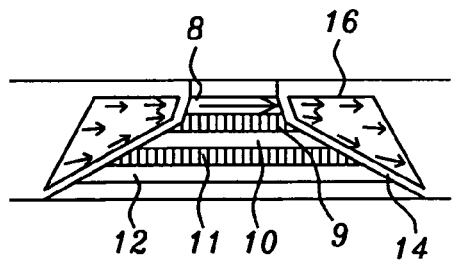
FIG. 8c

MR SENSOR WITH FLUX GUIDE ENHANCED HARD BIAS STRUCTURE

BACKGROUND OF THE INVENTION

1. Field of the Invention

This invention relates generally to the fabrication of a MR sensor. In particular it relates to an MR sensor in which a hard bias layer can be reduced in thickness and enhanced in effect by means of a flux guide structure.

2. Description of the Related Art

With the ever increasing areal density with which data is stored on magnetic media such as disks in hard disk drives (HDD), the magneto-resistive (MR) sensor that is used as the read-back element in the HDD is required to have a correspondingly improved spatial resolution while achieving and maintaining a reasonable signal-to-noise ratio (SNR). Referring to schematic FIGS. 1a, 1b and 1c, there are shown three views of a generic, prior-art current-perpendicular-to-plane (CPP) MR read head. FIG. 1a illustrates the read head in a vertical cross-sectional plane parallel to its air bearing surface (ABS) plane. FIG. 1b illustrates the read head from an overhead view of a horizontal cross-sectional plane through its magnetically free layer (discussed below). FIG. 1c is a portion of the illustration of FIG. 1a, isolating the sensor stack portion of the head.

Referring to FIG. 1a, there is shown the CPP MR head, which could be a CPP-GMR head (current perpendicular-to-plane giant-magneto-resistive head), in which there is a current that passes perpendicularly to the active magnetic layers through the entire head structure and in which the resistance of the head varies in accord with the physical principles of the giant-magneto-resistive effect. Alternatively, the head could be a CPP-TMR (current perpendicular-to-plane tunneling magneto-resistive) head, in which there is a current that passes perpendicularly to the active magnetic layers through the entire head structure and in which the resistance of the head varies in accord with the physical principles of the tunneling-magneto-resistive effect. Either of these particular types of head, which are state-of-the-art read-back heads, will be well represented by the discussion that follows.

FIG. 1a shows the following physical elements of the generic prior art head. Looking vertically downward, there is first shown an upper (or top) shield (1) that protects the sensor stack (6) from extraneous magnetic fields. At the bottom of the head, there is shown a corresponding lower (or bottom) shield (2) that performs a similar task at the bottom edge of the sensor. Thus the sensor is protected by a pair of shields at some desired separation (3).

Hard bias (HB) magnets (4) (magnets formed of hard magnetic material) are laterally disposed to either side of the sensor stack (6). These magnets, which stabilize the magnetization of the free layer (8) are positioned between the shields (1), (2) and their magnetizations are shown as arrow (5). These hard magnetic layers are formed on underlayers (20) that promote the requisite crystalline anisotropy. The sensor stack itself (6) is typically formed as a patterned lamination of five horizontal layers, formed beneath an upper capping layer (18). An arrow (7) shows the direction of magnetization of the magnetically free layer of the sensor stack, as seen in FIG. 1c.

FIG. 1b is a horizontal cross-sectional slice through the two HB layers (4) and the magnetically free layer (8) of the sensor stack, as will be discussed below.

Referring to FIG. 1c, there is shown a schematic, illustration of the isolated sensor stack (6) of FIG. 1a showing the following five horizontal layers: the magnetically free layer (8), showing it magnetization vector as an arrow (7); a layer (9) that is a dielectric layer that serves as a tunneling barrier layer for the TMR sensor, or is a conducting layer (9) for the GMR type sensor, a reference layer (10), a coupling layer (eg. a layer of Ru) (11), a pinned layer (12) whose magnetization is held spatially fixed by a thick layer (19) of antiferromagnetic material that also pins layer (10). The hard biasing layers (4), with longitudinal magnetization (5), provides a biasing magnetic field in the sensor stack (6) to orient the magnetization (7) of the free layer (8) in a longitudinal direction. A capping layer (18) is positioned between the free layer (8) and the upper shield (1). In forming the sensor, the stack and the hard bias layers are defined by a single etching process that insures they are at the same height.

In the most modern disk drives, the height at which the head flies above the rotating disk is already less than 5 nm, so the freedom of further flying height reduction to increase spatial resolution is reaching its limit. Thus, the common practice to increase the resolution is by reducing the reader-shield-spacing (RSS) (3), so the magnetic spatial resolution increases correspondingly.

To reduce RSS, the thickness of the hard bias (HB) layers (4) will need to decrease as well. However, reducing the thickness of these magnetic HB layers will also reduce the amount of magnetic "charge" at the edges of the HB layers immediately adjacent to the sensor stack and facing the edges of the free layer. The fewer the magnetic charges, the less is the pinning field of the HB layers and the less effective they are at orienting the free layer magnetization. Meanwhile, with a much smaller spacing between the HB layers and the upper read shield (1), magnetostatic coupling between the HB layer and the upper shield is increased, which can rotate the magnetization of the HB layers away from their desired orientation at the free layer edges. Thus the effective field of the HB layers at the free layer is degraded by these two effects, less magnetic charge and magnetostatic coupling to the upper shield.

Studies (see: Y. Zhou, "Thermally Excited Low Frequency Magnetic Noise in CPP Structure MR Heads," IEEE Trans. Magn., vol 43, pp 2187, 2007) show that a weakened HB field increases the noise produced by the sensor and will ultimately affect the reading process in high density magnetic recording. To increase the HB field for thinner HB layers, a higher HB magnetic moment and/or closer HB to free layer spacing is required. To reduce the effects of magnetostatic coupling between the HB layers and the reader shield, common practice is to increase the coercivity of the HB material (D. J. Larson et al., U.S. Pat. No. 7,061,731 B2; P. V. Chau et al., US Publ. Pat. Appl. 2005/0066514; H. S. Gill, US Publ. Pat. Appl. 2006/0114622 A1; M. M. Pinarbasi, US Publ. Pat. Appl. 2006/0087772 A1) so that the HB magnetization does not easily rotate because of the magnetostatic coupling to the upper shield. However, increasing the magnetic moment and increasing the coercivity of the HB materials are contradictory procedures according to the physics of magnetic materials. Increasing one property decreases the other. Thus, a high moment, high coercivity HB material is difficult to achieve so that it produces enough HB field on the free layer and is stable enough at narrow RSS.

In addition to the higher spatial resolution of the MR sensor in the down-track direction that requires a narrower RSS, higher area density of recorded data requires a higher track density so that the data tracks can be recorded more closely together. The track width will therefore be reduced, which also requires the reader to be narrower. For the conventional HB layer, as the width of the sensor stack diminishes, the distance between the HB and the stack edges does not diminish proportionally, because of the minimum interlayer distance that is required between the stack edges and the HB layer edges. This interlayer includes both a nonconductive layer that electrically isolates the HB layer from the sensor stack and an underlayer between the HB layer and the nonconductive layer to promote the crystalline growth of the HB layer in order to maintain a high coercivity. According to the prior study of Y. Zhou, cited above, this limitation on the minimum HB-to-sensor stack distance leads to a lower HB field gradient from the free layer edge to the free layer center. A lower HB gradient makes the MR sensor either have a higher noise production at the same sensitivity or a lower sensitivity in order to maintain the same noise level. Either of these alternatives leads to a lower signal-to-noise (SNR) ratio as sensor width is reduced.

The most ideal structure for an HB layer at narrow RSS and a narrow sensor width, is a thin and high-moment HB layer positioned as closely as possible to the free layer edge. This will only produce enough bias field to quench the self-demagnetization field of the free layer edge and, thereby, reduce random fluctuations in the free layer magnetization while producing much less field in the center of the sensor to avoid reducing sensor sensitivity.

To achieve a high moment in the HB layer, while still maintaining its magnetic stability, M. Arasawa et al., US Publ. Pat. Appl. 2006/0158793 A1 have suggested a dual-HB layer design as illustrated in FIG. 2a. A first pair of HB layers (13) are positioned at the sides of the sensor stack (6). A second pair of HB layers (4) are positioned laterally outside of layers (13). The inner HB layers (13) have a higher magnetic moment than the outer HB layers (4) and produce a high HB field in the free layer (8) of the stack (6). However, as the higher moment material of HB layer (13) usually also has a lower coercivity, the outer HB layers (4) are formed of material with lower moment but higher coercivity and are used to stabilized the inner layers (13) by applying their magnetic fields to the inner layers (13). This prior art, however, has the following limitations.

(1) The prior art proposes that the inner HB layer (13) be formed of a hard magnetic material similar to that of HB layer (4), but with a higher moment, which makes the underlayer between HB (13) and the sensor stack (6) still indispensable, so the distance between (13) and (6) cannot be further reduced.

(2) The prior art specifies that the product $M_s t$ (magnetic moment, $M_s$, times thickness, t) of the outer HB layer (4) needs to be greater than the same product of HB (13), so that HB (13) can be fully magnetized by HB (4). Although such a relationship can help maintain a full saturation of HB (13) magnetization at the edge facing FIB (4), it may not be able to prevent the magnetostatic coupling between of HB (13) to the upper shield (1) at the edge where HB (13) faces the sensor stack (6), because the HB (4) field produced in HB (13) decreases in inverse proportion to the distance from the HB (4) edge facing HB (13).

(3) The prior art also notes that HB (13) can be a soft magnetic material. However, it lacks details as to how one makes a soft HB (13), with coercivity approximately 0, to work in the structure shown in FIG. 2a. Since the prior art does not specify any additional features, except that HB (4) has a higher $M_s t$, to make a soft HB (13) work, it is only logical to deduce that the prior art assumes a commonly adopted approach in forming the HB (13) on the sides of the sensor stack (6) and defining the back edges of the free layer and the HB layer in a single step etching process, leading to the top view shown schematically in FIG. 2b. A soft HB layer (13) as in FIGS. 2a and 2b would be difficult to stabilize by the field of HB (4) because the soft HB (13) can have a much higher moment and a lower coercivity. Coupling to the upper shield and perturbation by external fields will be much stronger. In addition, with the same uniform stack height of the soft HB (13) and the free layer, coupling between the free layer and the HB (13) also exists during read-back and can lead to large amounts of side reading. FIG. 3 displays simulated cross-track read-back profiles of a generic HB MR sensor and a FIG. 2a type structure MR sensor with HB (13) being formed of soft material. The coupling between the free layer and the HB layer (13) leads to significant side reading, where HB (13) is rotated by the field of the medium from side tracks and the magnetization of the free layer rotates as a result of coupling with HB (13).

The present invention will address the problems alluded to above by achieving an optimum hard bias field on the free layer of a MR sensor stack at a narrow reader shield spacing (RSS).

SUMMARY OF THE INVENTION

A first object of this invention is to provide a hard bias (HB) layer to stabilize the free layer of an MR sensor in a CPP MR read head having a narrow shield-to-shield spacing.

A second object of the present invention is to provide such a CPP MR read head where the edge of the free layer is effectively pinned by the HB layer yet maintains sufficient sensitivity to produce a high signal to noise ratio (SNR).

A third object of this invention is to utilize a high moment, soft magnetic flux guide structure to conduct the flux produced by a hard magnetic bias layer and to locally concentrate the flux at the free layer edges by the shape anisotropy of the flux guide and to thereby produce a high field gradient from the free layer edge to its center, i.e., to achieve an ideal HB field across the entire free layer.

A fourth object of this invention is to achieve minimal coupling between an upper (top) shield and a hard bias layer by using a flux guide structure that is a thin layer of soft magnetic material.

A fifth object of this invention is to optimize the flux guide field on the free layer and to optimize the HB layer coercivity independently.

A sixth object of this invention is to attain all the previous objects while also achieving improved cross-track resolution during read-back.

These objects will be met by a CPP MR read head design in which a thin layer flux guide (FG) structure, formed of soft magnetic material having high magnetic moment, is placed between the HB layer and the adjacent edges of the free layer.

The FG shall have a magnetic moment of similar or higher value than the moment of the free layer. Because of its high moment and thin layer structure, out of plane magnetization of the FG is effectively quenched by the surface demagnetization field. Thus FG magnetization will only rotate in-plane, which significantly reduces the magnetostatic interaction with the reader shield at narrow RSS.

It is to be noted that flux guides are known in the prior art, as, for example, Gill, U.S. Pat. No. 7,237,322 who discloses a flux guide on either side of a free layer, but contacting the free layer; and Wu, U.S. Pat. No. 7,170,721, who also discloses a flux guide along one side of an MR stack. But neither of these inventions provide the characteristics of the present invention to meet its intended objects.

The present flux guide (FG) shall have a tapering shape, with the FG edge facing the HB layer having a longer SH (stripe height) than its edge adjacent to and facing the free layer.

As will be seen in schematic FIGS. 4a, 4b and 4c, below, the FG magnetization closer to the HB edge follows the HB field and forms a continuous magnetic flux path within the FG as the flux propagates towards the free layer and then away from the free layer.

Because the FG is a soft magnetic layer, it does not require an underlayer ((20) in FIG. 1a) to promote crystalline anisotropy, but only an isolation layer ((14) in FIG. 4c) to electrically insulate it from the adjacent free layer edge. Such an insulating layer can be made thinner than the underlayers required by the generic prior art HB layers formed of hard magnetic materials. Therefore, the FG edge can be placed much closer to the free layer edge than could a HB layer of the prior art and, as a result, a more efficient HB field is applied to the free layer.

The HB layer (4) laterally outside the FG layer is grown with the usual procedures, including the necessary underlayers (20) required to produce crystalline anisotropy, but with much less limitation on underlayer thickness than would normally be required by the imposition of a narrow RSS. The HB layer as described in this invention can be optimized for high coercivity without much impact on the actual HB field on the free layer. At the same time, the FG layer, with its tapered shape, greatly reduces the magnetostatic coupling between the FG and the free layer through back-end magnetic charges. As a result, side reading due to FG coupling to the free layer is eliminated.

BRIEF DESCRIPTION OF THE DRAWINGS

FIG. 1a is a schematic representation of a prior-art CPP-MR read head as viewed from the ABS.

FIG. 1b is a schematic representation of the prior-art CPP-MR read head of FIG. 1a, now as viewed from above at a horizontal cross-sectional level taken through the free layer.

FIG. 1c is a schematic, more detailed representation of the sensor stack of the prior-art CPP-MR read head of FIG. 1a as viewed from the ABS.

FIG. 2a is a schematic representation of an alternative form of prior-art CPP-MR read head, intended to overcome some of the difficulties with the read head of FIG. 1a, as viewed from the ABS.

FIG. 2b is a schematic representation of the prior-art CPP-MR read head of FIG. 2a, now as viewed from above at a horizontal cross-sectional level taken through the free layer.

FIG. 3 is a graphical representation comparing the performance of sensors of the types shown in FIG. 1a and FIG. 2a.

FIG. 5a is schematic illustration showing simulated quiescent state magnetic field vectors in a prior art sensor of the type illustrated in FIG. 1a.

FIG. 5b is schematic illustration showing simulated quiescent state magnetic field vectors in a sensor of the present invention as illustrated in FIG. 4a.

FIG. 6a is a graphical representation of the comparison between prior art sensors and the present sensor showing off-track reading performance as a function of sensor height and width.

FIG. 6b is a graphical representation of the comparison between the same prior art sensors and the present sensor of FIG. 6a showing cross-track sharpness vs. 50% amplitude off-track distance.

FIG. 7 is a graphical representation of the noise power spectrum of a prior art sensor and the sensor of the present invention.

FIG. 8a is a schematic representation of the CPP-MR read head of a second embodiment of the present invention as viewed from the ABS.

FIG. 8b is a schematic representation of the CPP-MR read head of FIG. 8a, now as viewed from above at a horizontal cross-sectional level taken through the free layer.

FIG. 8c is a schematic, more detailed representation of the sensor stack of the CPP-MR read head of FIG. 8a as viewed from the ABS.

DESCRIPTION OF THE PREFERRED EMBODIMENTS

Each of the preferred embodiments of this invention is a shielded read head incorporating a CPP MR sensor structure having a free layer that is longitudinally biased by a laterally disposed configuration of biasing layers formed of the hard magnetic materials Co, Fe, B, Ni, Pt, Cr, or any of their combinations, denoted hereinafter simply as hard bias layers or HB layers, whose flux is channeled through thin, tapered (generally in both depth and thickness) flux guides (denoted FG) formed of soft magnetic materials, which are the elements or the alloyed combinations of the elements Fe, Co, Ni, B, Mn, Cr, Ru or Ta. The tapered FG are interposed between the long (in depth) sides of the HB layers and the short sides of the free layer so that the field of the HB layers is "funneled", by the tapering shape, through the FG. In this way, the HB layers bias the free layer effectively through the interposition of the FG, yet the thicker HB layers are sufficiently removed laterally from the free layer that there is no adverse effect from their interaction with the reader shields.

Embodiment 1

In what follows, for ease and consistency of description, laterally directed dimensions (in the ABS plane) will be denoted "widths," vertically directed dimensions (in the ABS plane) will be denoted "thicknesses" and dimensions directed from the ABS plane of the sensor towards the backside will be denoted "depths." If other terms are utilized, they will be defined as needed. For example, the depth direction will sometimes be referred to as the "stack height."

Figure 4A:
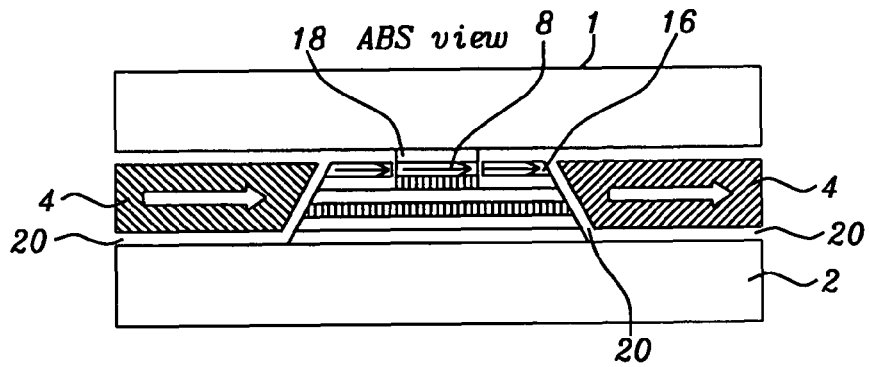
FIG. 4a is a schematic representation of the CPP-MR read head of a first embodiment of the present invention as viewed from the ABS.
Figure 4B:
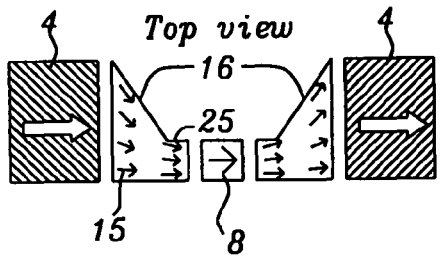
FIG. 4b is a schematic representation of the CPP-MR read head of FIG. 4a, now as viewed from above at a horizontal cross-sectional level taken through the free layer.
Figure 4C:
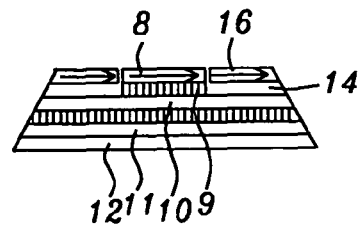
FIG. 4c is a schematic, more detailed representation of the sensor stack of the CPP-MR read head of FIG. 4a as viewed from the ABS.

Referring now to schematic FIGS. 4a, 4b and 4c, there is shown, first, in FIG. 4a, an ABS view of a first embodiment of the present invention. Reader shields (1) (top or upper shield) and (2) (bottom shield) are formed above and below the CPP MR sensor stack (6) that is patterned to accept the short substantially vertical edges of the flux guides (16) on either side of the substantially vertical edges free layer (8). The sensor stack is a vertical lamination of horizontal layers that will be described below. The reader-shield-separation (RSS) is between approximately 10 and 40 nm.

The hard bias (HB) layers (4) are adjacent to the longer, slightly sloped lateral edges of the FG layers, as will be described in greater detail with reference to FIGS. 4b and 4c. The HB layers are typically formed on crystal growth-enhancing underlayers (20), such as layers of Ti, Cr, Al, Mg or their combinations or combinations with O, formed to between approximately 3 and 10 nm in thickness, and formed beneath the HB layers and between the HB layers and the FG.

Referring next to FIG. 4c, there is shown a more detailed ABS view of the patterned MR sensor stack (6) showing the FG layers (16) abutting the narrow (in width) patterned free layer (8), which has a width of between approximately 10 and 100 nm and a thickness between approximately 2 and 10 nm. Arrows show the magnetizations of the FG layers and the free layer. A similarly narrow in width patterned conducting or dielectric barrier layer (9) is formed beneath the free layer, depending on whether the sensor stack is GMR or TMR, respectively.

Because the free and conductive or barrier layers are patterned by etching away their deposited layers material to either side, the remaining lamination exhibits an exposed upper surface that now extends symmetrically to each side of the patterned free and barrier layers. Going vertically downward, this remaining portion of the sensor stack includes, respectively, a reference layer (10), a coupling layer (11), that is preferably a layer of Ru, and a pinned layer (12). A pinning layer (19), typically of an antiferromagnetic material, is formed between the pinned layer and the bottom shield, pinning both the pinned (12) and reference (10) layers.

The flux guide layer (16) is separated from the horizontal exposed upper surface reference layer and from the vertically etched sides of the free and barrier layers by an insulating layer (14) that is formed to a thickness between approximately 1 and 3 nm. A capping layer (18) (shown in FIG. 4a), formed of a material such as Ta, provides electrical contact between the free layer (8) and the top shield (1). However, the FG layers are electrically insulated by layer (14) from the passage of current through this CPP configuration, as current passes vertically downward only through the capping layer and free layer and the layers beneath them. As can be seen in the figure, the sides of the FG farthest from the free layer is patterned to be co-planar with the plane formed by the outer lateral edges of the remaining layers of the sensor stack. The inner sides of the HB layers as shown in FIG. 4a are substantially conformal to the shape of the plane formed by the outer lateral edges of the remaining layers and the FG layer. The HB layers, however, are separated from the lateral sides by the underlayer (20), as shown in FIG. 4a.

Looking now at schematic FIG. 4b, there is shown a horizontal cross-sectional view of the structure in FIG. 4a taken at the level of the free layer. There are seen the two HB layers (4), the free layer (8) and the two FG layers (16) that are disposed between the HB layers and the free layer. The free layer (8), shown here as substantially square, has a depth dimension (in the ABS-to-back edge direction) of between approximately 10 to 100 nm, corresponding to the same approximate lateral width in the ABS dimension. The FG is tapered, with a larger (in area and particularly in its depth dimension) outer edge adjacent to the inner edge of the HB layer and a smaller (vertical) inner edge adjacent to the free layer and barrier layer. The width of the FG in the ABS plane is similar to that of the free layer, namely between approximately 10 and 100 nm and the depth of the inner edge of the FG is between approximately 10 and 100 nm. A small portion (25) along the back edge of the FG, having the same depth as the free layer, is etched towards the HB layer. The FG layers taper down from a maximum height where they are adjacent to the HB layers, to a minimum height, where they are adjacent to the free layer edges. The product of the FG thickness, t, facing FL and FG magnetic moment, $M_s$, (actually, the product is $M(FG)_s t(FG)$) needs to be equal to or larger than the corresponding product $M_s t$ of the free layer (8) (actually $M(FL)_s t(FL)$) where $M_s$ is the symbol for the magnetic moment and the parentheses contain the relevant structure of the flux guide or the free layer and t is the symbol for thickness of the flux guide edge or the free layer.

Arrows (15) show the flux lines beginning adjacent to the HB layer and funneling in the direction towards the free layer, then funneling away from the free layer, through the FG layer on the opposite side. The tapering shape of the FG confines the magnetic flux originating in the HB layer within itself, due to its shape anisotropy. There is minimal flux leakage beyond the FG structure itself and the flux is effectively focused towards the free layer edge as shown. The flux emerges from the FG only at its tapered end adjacent to the free layer, at which position the HB layer field is locally produced. Thus, the free layer is biased by the closely positioned FG (16), while the actual FG magnetization focusing direction is oriented by the HB field which emerges from outside the FG layers. At narrower RSS, although the HB layer thickness must be correspondingly reduced and the magnetic flux it produces will be less, the FG collects and focuses the HB flux in the stack height (depth) direction. With a high enough ratio of the FG height facing the HB layer to the FG height facing the free layer, an optimal biasing of the free layer can still be achieved even with the weaker HB field. Considering commonly used FIB and FG materials, the height ratio should be at least 2 to achieve a significantly higher field at the free layer edge. Meanwhile, a FG to free layer edge spacing of less than the free layer thickness is needed to produce enough field on the free layer with the thin layer FG.

The FG as a soft magnetic layer does not require an underlayer to promote crystalline anisotropy, but only an isolation layer (14) to electrically insulate it from the free layer edge. Such an insulating layer can be made thinner than the underlayers required by the generic HB layers formed of hard magnetic materials. Therefore, the FG edge can be placed much closer to the free layer edge than could a HB layer of the prior art and, as a result, a more efficient HB field is applied to the free layer.

The HB layer (4) outside the FG layer is grown with the usual procedures, including the necessary underlayers (20) required to produce crystalline anisotropy, but with much less limitation on underlayer thickness than would normally be required by the imposition of a narrow RSS. The HB layer as described in this invention can be optimized for high coercivity without much impact on the actual HB field on the free layer. At the same time, the FG layer, with its tapered shape, greatly reduces the magnetostatic coupling between the FG and the free layer through back-end magnetic charges. As a result, side reading due to FG coupling to the free layer is eliminated.

To fabricate the MR sensor structure of FIGS. 4a, 4b and 4c, the procedures can be, but are not limited to, the following steps. The sensor stack (6) can be formed with the pattern shown by applying a partial top-down etching to the deposited sensor stack that stops in the barrier/conductive layer (9)., so that only the free layer (8) and some depth into the barrier/conduction layer (9) are patterned by the etching process. Layers (10), (11) and (12) remain intact after this etching process. Following the etching process, a thin insulating layer (14) is deposited over the etched surface to form an electrical isolation layer on top of which the FG layer is deposited as a refill of the etched portion of the free layer. As shown in FIG. 4a, the refilled MR stack can be exposed to a second etching. The MR stack with the refilled FG layer are etched sequentially in this second etching to form the final patterned sensor structure with two side walls. After the second etching, the under-layers required for the HB layer growth are deposited on the etched surfaces and followed by the HB layer depositions.

The FIG. 4b type sensor SH structure can also be formed by a two-step etching process, where the first step etching forms the free layer back edge and the tapering slope of the FG (16) simultaneously and the second step forms the HB back edge and the FG top edge simultaneously. The first step etching can also extend to a certain depth (25) laterally (towards the HB layer) into the FG to form a flat edge of the same position as the free layer back edge to accommodate process variations. This depth shall not exceed the magnetic exchange length of the FG material and should be preferably less than 50 nm.

Referring next to FIG. 5a, there is shown simulated quiescent state magnetization (arrows) of the free layer (8) for a generic prior art MR sensor with a HB layer (4) as in FIG. 1a. FIG. 5b shows magnetizations of the free layer (8) and the FG (16) in a FG enhanced HB sensor having the same free layer properties as in FIG. 5a. We consider a free layer of dimension 40 nm by 40 nm by 5 nm thickness. FIG. 5b has a FG of the same material and thickness as the free layer. FIG. 5b also shows a clear FG magnetization (arrows) focusing towards the free layer edges.

Figure 3:
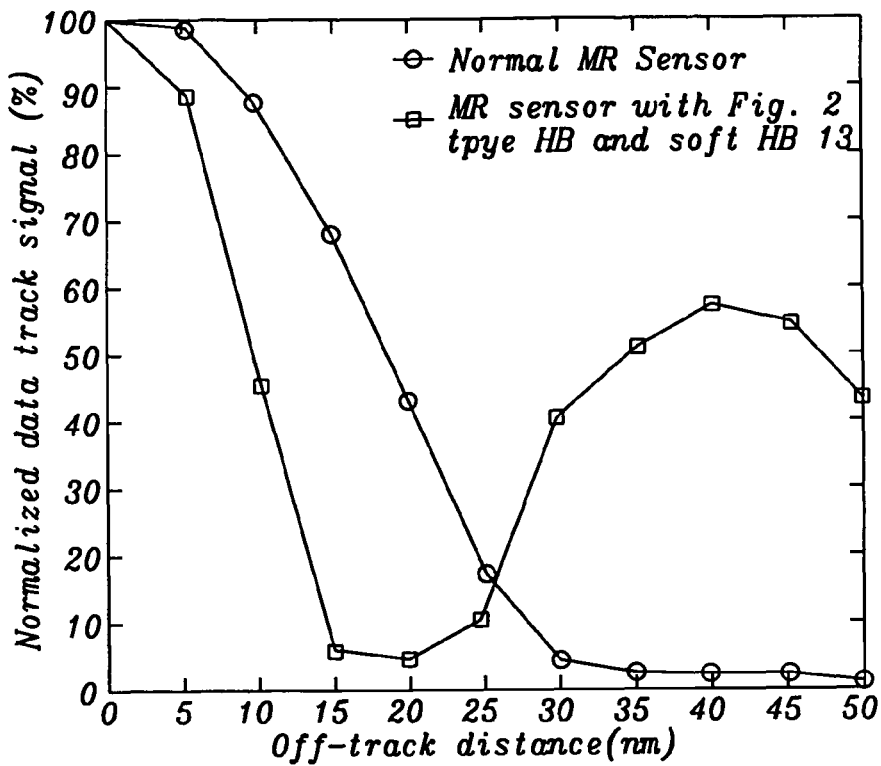

Referring next to FIG. 6a, there is shown a simulated read-back signal cross-track profile comparison between a prior art HB and an FG enhanced HB of the present invention. Free layers of 40 nm track width (TW) by 40 nm depth (or stack height, SH) and free layers of 30 nm by 30 nm are considered. From the profiles in FIG. 6a the tapered FG enhanced HB as in FIG. 5b shows similar cross-track profiles as prior art conventional HB as in FIG. 5a, where the 50% track width (TW) is approximately the same. No side reading as shown in FIG. 3 is seen. However, FG HB combination of the present invention shows a lower tail in the cross-track profile than the conventional prior art HB with no FG at about 20 nm to 25 nm off-track distance. The y-axis in FIG. 6b is "sharpness ratio", the 10% amplitude off-track distance (i.e., the distance at which the read-back amplitude is 10% of the maximum amplitude) divided by the 50% amplitude off-track distance, which is a measure of the reading characteristics of the sensor. For higher track density, smaller side reading is preferred, which means a smaller sharpness ratio is preferred.

As FIG. 6b shows, for both the 30 nm and 40 nm free layer sizes, the FG HB structure of the present invention exhibits better sharpness than the conventional prior art HB structure at the same 50% width. The better sharpness of the FG HB structure is the result of the FG layer being closer to the free layer edge, so that the side track flux can flow partially into the FG magnetization and cause less free layer response. However, such partial medium flux conduction by the FG does not cause any HB field degradation on the free layer due to the much larger size of the FG which permits it to dissipate the medium flux over a large area.

Referring to FIG. 7 there is shown the simulated noise power spectrum from the sensor having a 40 nm by 40 nm free layer and both a HB layer with and without the FG of the present invention. The HB layer with the FG shows a first peak frequency that is approximately 1 GHz higher than the convention sensor without the FG. The FG supplied sensor also has a noise floor at <2 GHz (see the vertical dashed line) that is about 3 dB lower than the conventional sensor. Both of these results indicate an effectively higher HB field on the free layer and the effectiveness of the FG structure in conducting and focusing the HB flux to bias the free layer more effectively than the prior art sensor without the FG.

Embodiment 2

Referring now to schematic FIGS. 8a, 8b and 8c, there is shown, first, in FIG. 8a, an ABS view of a second embodiment of the present invention, in FIG. 8b there is shown a top view (cross-section between the shields) of FIG. 8a and in FIG. 8c there is shown a more detailed view of the sensor stack (6) components and the positioning of the FG layer (16) and its magnetization vectors (arrows).

Reader shields (1) (top or upper shield) and (2) (bottom shield) are formed above and below (RSS separation approximately 10 to 40 nm) the CPP MR sensor stack (6) that is patterned to accept the short edges of the flux guides (FG) (16) on the etched slopes of the sensor stack. These etched slopes can extend through more than two layers of the MR stack. It is noted that the width of the free layer (8) is between approximately 10 and 100 nm and the widths of the layers (9)-(12) below the free layer are greater, corresponding to the slope of the sides. Unlike the patterned shape of FIG. 4a, where the free (8) and barrier (9) layers were etched vertically downward to expose a laterally extending surface of the reference layer (10), in this embodiment, the sides of the free (8) and barrier (9) layers are both sloped by etching as shown, to produce a first and second sloped portion of the lateral sides of the MR stack. The FG (16) has a tapering shape with a first and second sloped portion that conformally follows the dual slopes of the sensor stack. The FG has an opposite lateral side with a single slope further away from the sensor edge, towards the HG layer (4). The FG (16) and the sensor stack are separated by an insulator layer (14) whose thickness is between approximately 1 and 3 nm. During operation, the electrical sensing current only flows through the free layer (8) and the layers beneath, while the FG layers are insulated from the current path. The HB layer (4) exists on both sides of the sensor stack and FG, being positioned laterally outside the FG edge. The FG (16) can be in direct contact with the HB (4) and exchange coupled to it when the FG is the outermost layer after sensor stack patterning. Alternatively, the HB can be separated from the sensor stack and FG with necessary under-layers ((20) in FIG. 8c) formed between them.

As seen in FIG. 8b, the FG (16) also has a tapering shape in the SH (depth) direction. The tapering shape in both thickness and SH (depth) creates a funneling of the magnetic flux through the FG between the HB layers and the free layer, as can be seen by the arrows in FIG. 8b and FIG. 8c. As already noted above, in the description of the first embodiment, the product of the FG (16) thickness, t, facing FL and FG magnetic moment, $M_s$, (actually, $M(FG)_s t(FG)$) needs to be equal to or larger than the corresponding product $M_s t$ of the free layer (8) (actually $M(FL)_s t(FL)$) where $M_s$ is the symbol for the magnetic moment and the parentheses contain the relevant structure of the flux guide or the free layer and t is the symbol for thickness of the flux guide edge or the free layer, both of which are between approximately 2 and 10 nm).

Preferably the FG should have a SH facing the HB that is at least two times that of the SH of the FG facing the free layer. Spacing between the FG and the free layer edges is preferably equal to or less than the free layer thickness.

Referring next to FIG. 8c, there is shown the patterned CPP MR sensor stack (6) with the FG layers (16) conformally abutting its sloping patterned lateral sides. Arrows show the longitudinal magnetizations of the FG layers and the free layer. A similarly patterned conducting or dielectric barrier layer (9) is formed beneath the free layer, depending on whether the sensor stack is GMR or TMR, respectively.

Beneath the free and barrier layers, and progressively wider than those two layers, there are formed, respectively, a reference layer (10), a coupling layer (11), preferably a layer of Ru, and a pinned layer (12). A pinning layer (19) is formed between the pinned layer and the bottom shield, pinning both the pinned and reference layers. The flux guide layer (16) is separated from the reference layer and from the sides of the free and barrier layers by an insulating layer (14). A capping layer (18) provides electrical contact between the free layer and the top shield. However, the FG layers are electrically insulated by layer (14) from the passage of current through this CPP configuration, as current passes vertically downward only through the capping layer and free layer and the layers beneath them.

Looking now at schematic FIG. 8b, there is shown a horizontal cross-section taken through the read head at the level of the free layer. There are seen the HB layers (4), the free layer (8) and the FG layers (16) between the HB layers and the free layer. The FG layers taper down from a maximum depth and thickness where they are adjacent to the HB layers, to a minimum depth and thickness, where they are adjacent to the free layer edges. Note that the maximum sized edge is greater than the corresponding edge in the first embodiment, which did not conformally abut the full side of the HB layer. Arrows (15) show the flux lines beginning adjacent to the HB layer and funneling in the direction towards the free layer and then funneling from the free layer towards the opposite side FG layer. The tapering shape of the FG confines the magnetic flux originating in the HB layer within itself, due to its shape anisotropy. There is minimal flux leakage beyond the FG structure itself and the flux is effectively focused towards the free layer edge as shown. The flux emerges from the FG at its tapered end adjacent to the free layer, at which position the HB layer field is locally produced. Thus, the free layer is biased by the closely positioned FG (16), while the actual FG magnetization focusing direction is oriented by the HB field which emerges from outside the FG layers.

The HB layer (4) laterally outside the FG layer is grown with the usual procedures, including the necessary underlayers (20) required to produce crystalline anisotropy, but with much less limitation on underlayer thickness than would normally be required by the imposition of a narrow RSS. The HB layer as described in this invention can be optimized for high coercivity without much impact on the actual HB field on the free layer.

The fabrication of the second embodiment is easier than that of the first embodiment but the second embodiment may have a greater shield coupling effect due to the thicker FG layer. This may still be a viable solution for achieving a stronger biasing field on the free layer at a narrow RSS and thin HB condition, with both the thickness and SH tapering of the FG layer.

To fabricate the MR sensor structure of FIGS. 8a, 8b and 8c, the procedures can be, but are not limited to, the following steps. A first patterning of the sensor stack that forms two slopes on the sides. Afterwards, a thin layer (14) is deposited on the sloped sides to form insulation between the sensor and the FG (16) and the FG is deposited on this layer as a refill of the etched slopes and forms a tapering shape towards the free layer edge. The refilled MR stack is then exposed to a second etching to form the final patterned sensor structure with two sidewalls. After this second etching process, the HB layer is directly deposited onto the etched surfaces or deposited on an underlayer that is first formed. A first step back edge etching (forming sloped edges as shown in FIG. 8b) forms the back edge of the free layer and the tapering slope of the FG simultaneously. This first step back edge etching can also extend for a certain distance ((25) in FIG. 8b) into the FG to form a flat edge in the FG at the same position as the back edge of the free layer to accommodate process variations. This distance shall not exceed the magnetic exchange length of the FG material and should preferably be <50 nm. Finally, a second step of back edge etching forms the back edge of the HB layer and the FG top edge simultaneously.

As is finally understood by a person skilled in the art, the preferred embodiments of the present invention are illustrative of the present invention rather than limiting of the present invention. Revisions and modifications may be made to methods, materials, structures and dimensions employed in forming and providing a CPP MR sensor in which a soft magnetic flux guide is interposed between a hard magnetic bias layer and the free layer of the sensor, while still forming and providing such a device and its method of formation in accord with the spirit and scope of the present invention as defined by the appended claims.

What is claimed is:

1. A CPP MR sensor, comprising:

a lower shield;

an upper shield, formed a vertical distance RSS above said lower shield;

a CPP MR stack formed between said lower shield and said upper shield, wherein said CPP MR stack is a vertical lamination of contiguous horizontal layers whose widths in a lateral direction are defined by patterned lateral sides, wherein said CPP MR stack includes a free layer and a barrier layer or a conductive layer formed beneath said free layer; wherein said free layer and said barrier layer or conductive layer have widths that are narrower than the widths of the remaining laminated layers; and a flux guide formed of soft magnetic material positioned adjacent to each side of said free layer; wherein said flux guide has a first lateral side that is positioned opposite to a side of said free layer and wherein said flux guide has a second lateral side that is opposite to said first lateral side; wherein said first lateral side is separated from said free layer by an insulating layer; and wherein a biasing layer formed of hard magnetic material is positioned adjacent to said second lateral side of said flux guide; wherein said second lateral side of said flux guide is larger in its depth dimension than said first lateral side and is positioned conformally opposite to said biasing layer, whereby a back side of said flux guide is tapered corresponding to said increase in its depth dimension from said first lateral side to said second lateral side and wherein $M_s t$ of said first lateral side of said flux guide is equal to or larger than the $M_s t$ of said free layer.

2. The CPP MR sensor of claim 1, wherein:

said free layer and said barrier layer or said conductive layer have a common width in a lateral direction defined by coplanar vertical sides and wherein a remaining portion of said lamination extends symmetrically in width beyond each of said coplanar vertical sides and terminates in oppositely sloping lateral sides; and wherein said first lateral side of said flux guide is vertical and positioned facing and conformal to said lateral side of said free layer and said second lateral side is opposite to said first lateral side and coplanar with said sloping lateral sides of said lamination; wherein a portion of said tapered back side of said flux guide is etched back perpendicularly from said first lateral side towards said second lateral side for a distance not to exceed a magnetic exchange length of said flux guide soft magnetic material.

3. The sensor of claim 2 wherein said flux guide layer is etched back for a distance that is less than approximately 50 nm.

4. The sensor of claim 2 wherein the separation between said first lateral side and said lateral edges of said free layer and said barrier layer is equal to or less that the thickness of said free layer.

5. The sensor of claim 1 wherein said second lateral side of said flux guide is separated from said biasing layer by an underlayer.

6. The sensor of claim 1 wherein said hard bias layer is formed of the hard magnetic materials Co, Fe, B, Ni, Pt or Cr or any of their combinations.

7. The sensor of claim 5 wherein said underlayer is formed of Ti, Cr, Al or Mg or combinations of Ti, Cr, Al, Mg and O and is formed to a thickness between approximately 1 and 3 nm.

8. The sensor of claim 1 wherein said sensor stack is a lamination comprising a pinned layer, a coupling layer formed on said pinned layer, a reference layer formed on said coupling layer, a dielectric barrier layer or a conductive layer formed on said reference layer and a free layer formed on said dielectric barrier layer or said conductive layer.

9. The sensor of claim 8 wherein a capping layer, having the reduced width of said free layer., is interposed between said free layer and said top shield.

10. The sensor of claim 8 wherein a pinning layer is formed beneath said pinned layer and wherein said pinning layer pins said pinned layer and said reference layer.

11. The sensor of claim 1 wherein said free layer, said reference layer and said flux guide layer are formed of the same or of different elements or of alloys of elements chosen from the group of Fe, Co, Ni, B, Mn, Cr, Ru or Ta.

12. The CPP MR sensor of claim 1 wherein:
each lateral side of said stack has a first and second sloped portion and wherein said first sloped portion extends through at least said free layer and said barrier layer; and
wherein said first lateral side of said tapered flux guide is positioned adjacent to said lateral side of said CPP MR stack and wherein said first lateral side of said tapered flux guide is formed with a first and second sloped portion that are, respectively, conformal to and uniformly separated from said first and second sloped portions of said lateral side of said CPP MR stack and wherein
said uniform separation between said flux guide and said CPP MR stack is filled with a non-conducting and non-magnetic underlayer; and wherein
said second lateral side of said flux guide, having a single slope, is adjacent to and uniformly separated from said biasing layer formed of hard magnetic material; wherein
a back side of said flux guide layer is etched back perpendicularly from said first lateral side towards said second lateral side for a distance not to exceed a magnetic exchange length of said flux guide soft magnetic material and wherein
$M_s t$ of said first sloped portion of said first lateral side of said flux guide is equal to or larger than the $M_s t$ of said free layer.

13. The sensor of claim 12 wherein said flux guide layer is etched back for a distance that is less than approximately 50 nm.

14. The sensor of claim 12 wherein said flux guide and said HB layer are in contact and magnetically exchange coupled.

15. The sensor of claim 12 wherein said hard bias layer is formed of any of the hard magnetic materials Co, Fe, B, Ni, Pt or Cr or their combinations.

16. The sensor of claim 12 wherein said underlayer is formed of Ti, Cr, Al or Mg or combinations of Ti, Cr, Al, Mg and O.

17. The sensor of claim 12 wherein said sensor stack is a lamination comprising a pinned layer, a coupling layer formed on said pinned layer, a reference layer formed on said coupling layer, a dielectric barrier layer or a conductive layer formed on said reference layer and a free layer formed on said dielectric barrier layer or said conductive layer.

18. The sensor of claim 17 wherein a capping layer is interposed between said free layer and said top shield.

19. The sensor of claim 17 wherein a pinning layer is formed beneath said pinned layer and wherein said pinning layer pins said pinned layer and said reference layer.

20. The sensor of claim 12 wherein said free layer, said reference layer and said flux guide layer are formed of the same or of different elements or of alloys of elements chosen from the group of Fe, Co, Ni, B, Mn, Cr, Ru or Ta.

21. The sensor of claim 12 wherein RSS is between approximately 10 and 40 nm.

22. A method of forming a CPP MR sensor comprising;
providing a substrate;
forming on the substrate a CPP MR sensor stack, wherein said sensor stack is a laminate including a top layer that is a free layer and a layer immediately beneath said free layer that is a barrier layer or a conductive layer;
patterning the CPP MR sensor stack by a method comprising:
etching vertically downward completely through said free layer and through said barrier layer or conductive layer, thereby defining parallel vertical sides and a narrow width for said free layer and for said barrier or conductive layer and removing portions of said free layer and said barrier or conductive layer laterally disposed from said vertical sides thereby exposing horizontal surfaces of said barrier or conductive layer laterally disposed away from said vertical sides; then
depositing a thin insulating layer conformally covering said etched vertical sides and said horizontal surfaces; and
depositing a thin layer of soft magnetic material to refill the region removed by the etching process and to form flux guide layers; then
etching lateral sides of said fabrication to form a final patterned sensor structure; then
depositing underlayers for growth of hard magnetic biasing layers and depositing said hard magnetic biasing layers laterally outside said flux guide layers and abutting said flux guide layers; then
etching back surfaces of the fabrication to form a back edge of said free layer and said barrier or conductive layer and, at the same time, a tapering slope of said flux guide layer; whereby
said flux guide layer is further etched back for a distance not to exceed the magnetic exchange length of said flux guide material.

23. The method of claim 22 wherein said flux guide layer is etched back for a distance that is less than approximately 50nm.

24. The method of claim 23 wherein said flux guide layer is etched back for a distance that is less than approximately 50 nm.

25. The method of claim 22 wherein the separation between said first lateral side and said lateral edges of said free layer and said barrier layer is equal to or less that the thickness of said free layer.

26. The method of claim 22 wherein said wherein said narrower width of said free layer and said barrier layer is formed by a partial etching of said sensor stack.

27. The method of claim 22 wherein said flux guide has a back edge that extends laterally from said first lateral edge.

28. The method of claim 22 wherein said second lateral side of said flux guide is separated from said biasing layer by an underlayer.

29. The method of claim 22 wherein said hard bias layer if formed of the hard magnetic materials Co, Fe, B, Ni, Pt or Cr or any of their combinations.

30. The method of claim 28 wherein said underlayer is formed of Ti, Cr, Al or Mg or combinations of Ti, Cr, Al, Mg and O and is formed to a thickness between approximately 1 and 3 nm.

31. The method of claim 22 wherein said sensor stack is a lamination comprising a pinned layer, a coupling layer formed on said pinned layer, a reference layer formed on said coupling layer, a dielectric barrier layer or a conductive layer formed on said reference layer and a free layer formed on said dielectric barrier layer or said conductive layer.

32. The method of claim 31 wherein a capping layer is interposed between said free layer and said top shield.

33. The method of claim 31 wherein a pinning layer is formed beneath said pinned layer and wherein said pinning layer pins said pinned layer and said reference layer.

34. The method of claim 31 wherein said free layer, said reference layer and said flux guide layer are formed of the same or of different elements or of alloys of elements chosen from the group of Fe, Co, Ni, B, Mn, Cr, Ru or Ta.

35. A method of forming a CPP MR sensor comprising;
providing a substrate;
forming on the substrate a CPP MR sensor stack, wherein said sensor stack is a laminate including a top layer that is a free layer and a layer immediately beneath said free layer that is a barrier layer or a conductive layer;
patterning the CPP MR sensor stack by a method comprising:
etching doubly sloped lateral sides of said sensor stack wherein a first slope defines lateral edges of said free layer and, partially, of said barrier or conductive layer and a second slope defines lateral sides of remaining layers of said laminate thereby removing lateral portions of said sensor stack;
depositing a thin insulating layer conformally covering said etched doubly sloped sides; and
depositing a thin layer of soft magnetic material to refill the region of said sensor stack removed by the etching process and to form flux guide layers, whereby inner lateral edges of said flux guide layers have a first slope that is conformal to and adjacent to said lateral edges of said free layer and a second slope that is conformal to and adjacent to said lateral sides of said remaining layers of said laminate; then
etching outer lateral edges of said flux guide layer to form a final patterned sensor structure; then
optionally depositing underlayers for growth of hard magnetic biasing layers and depositing said hard magnetic biasing layers laterally outside said outer lateral edges of said flux guide layers and abutting said flux guide layers; then
etching back surfaces of the fabrication to form a back edge of said free layer and said barrier or conductive layer and, at the same time, a tapering slope of said flux guide layer; whereby
said back surface of said flux guide layer is further etched back for a distance not to exceed the magnetic exchange length of said flux guide material.

36. The method of claim 35 wherein RSS is between approximately 10 and 40 Nm.

37. The method of claim 35 wherein said flux guide layer is etched back for a distance that is less than approximately 50 nm.

38. The method of claim 35 wherein said sensor stack is a lamination comprising a pinned layer, a coupling layer formed on said pinned layer, a reference layer formed on said coupling layer, a dielectric barrier layer or a conductive layer formed on said reference layer and a free layer formed on said dielectric barrier layer or said conductive layer.

39. The method of claim 35 wherein said sensor stack is a lamination comprising a pinned layer, a coupling layer formed on said pinned layer, a reference layer formed on said coupling layer, a dielectric barrier layer or a conductive layer formed on said reference layer and a free layer formed on said dielectric barrier layer or said conductive layer.

40. The method of claim 35 wherein said hard bias layer if formed of the hard magnetic materials Co, Fe, B, Ni, Pt or Cr or any of their combinations.

41. The method of claim 35 wherein said underlayer is formed of Ti, Cr, Al or Mg or combinations of Ti, Cr, Al, Mg and O.

42. The method of claim 35 wherein said hard bias layer if formed of the hard magnetic materials Co, Fe, B, Ni, Pt or Cr.

43. The method of claim 35 wherein said underlayer is formed of Ti, Cr, Al or Mg or combinations of Ti, Cr, Al, Mg and O.

* * * * *